(12) United States Patent
Wu et al.

(10) Patent No.: US 10,522,557 B2
(45) Date of Patent: Dec. 31, 2019

(54) SURFACE TOPOGRAPHY BY FORMING SPACER-LIKE COMPONENTS

(71) Applicant: Taiwan Semiconductor Manufacturing Co., Ltd., Hsinchu (TW)

(72) Inventors: Chun-Chang Wu, Nantou County (TW); Chihy-Yuan Cheng, Tainan (TW); Sz-Fan Chen, Hsinchu (TW); Shun-Shing Yang, Tainan (TW); Wei-Lin Chang, Hsinchu (TW); Ching-Sen Kuo, Taipei (TW); Feng-Jia Shiu, Hsinchu County (TW); Chun-Chang Chen, Tainan (TW)

(73) Assignee: TAIWAN SEMICONDUCTOR MANUFACTURING CO., LTD. (TW)

( * ) Notice: Subject to any disclaimer, the term of this patent is extended or adjusted under 35 U.S.C. 154(b) by 0 days.

(21) Appl. No.: 15/796,992

(22) Filed: Oct. 30, 2017

(65) Prior Publication Data

US 2019/0131313 A1 May 2, 2019

(51) Int. Cl.
*H01L 27/11546* (2017.01)
*H01L 21/311* (2006.01)
(Continued)

(52) U.S. Cl.
CPC .... *H01L 27/11546* (2013.01); *H01L 21/0276* (2013.01); *H01L 21/31058* (2013.01); *H01L 21/31111* (2013.01); *H01L 21/31144* (2013.01); *H01L 23/544* (2013.01); *H01L 27/11521* (2013.01); *H01L 27/11524* (2013.01); *H01L 29/42324* (2013.01); *H01L 29/6656* (2013.01);
(Continued)

(58) Field of Classification Search
CPC ........... H01L 27/11546; H01L 29/6656; H01L 21/31111; H01L 21/31144; H01L 21/31058; H01L 23/544; H01L 29/42324; H01L 29/66825; H01L 27/11521; H01L 21/0276; H01L 2223/54426; H01L 2223/5442; H01L 29/517; H01L 29/4958; H01L 29/4966
See application file for complete search history.

(56) References Cited

U.S. PATENT DOCUMENTS 6,074,905 A * 6/2000 Hu ..................... H01L 21/31111
257/E21.251
7,425,740 B2 9/2008 Liu et al.
(Continued)

FOREIGN PATENT DOCUMENTS

TW 200518282 6/2005
TW 201637134 10/2016

*Primary Examiner* — Anita K Alanko
(74) *Attorney, Agent, or Firm* — Haynes and Boone, LLP

(57) ABSTRACT

A wafer having a first region and a second region is provided. A first topography variation exists between the first region and the second region. A first layer is formed over the first region and over the second region of the wafer. The first layer is patterned. A patterned first layer causes a second topography variation to exist between the first region and the second region. The second topography variation is smoother than the first topography variation. A second layer is formed over the first region and the second region. At least a portion of the second layer is formed over the patterned first layer.

20 Claims, 12 Drawing Sheets

(51) Int. Cl.
*H01L 21/3105* (2006.01)
*H01L 21/027* (2006.01)
*H01L 27/11521* (2017.01)
*H01L 29/66* (2006.01)
*H01L 29/423* (2006.01)
*H01L 23/544* (2006.01)
*H01L 27/11524* (2017.01)
*H01L 29/49* (2006.01)
*H01L 29/51* (2006.01)

(52) U.S. Cl.
CPC .... *H01L 29/66825* (2013.01); *H01L 29/4958* (2013.01); *H01L 29/4966* (2013.01); *H01L 29/517* (2013.01); *H01L 2223/5442* (2013.01); *H01L 2223/54426* (2013.01)

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 8,048,723 B2 | 11/2011 | Chang et al. | |
| 8,053,299 B2 | 11/2011 | Xu | |
| 8,183,627 B2 | 5/2012 | Currie | |
| 8,362,575 B2 | 1/2013 | Kwok et al. | |
| 8,367,498 B2 | 2/2013 | Chang et al. | |
| 8,377,779 B1 | 2/2013 | Wang | |
| 8,399,931 B2 | 3/2013 | Liaw et al. | |
| 8,415,718 B2 | 4/2013 | Xu | |
| 8,440,517 B2 | 5/2013 | Lin et al. | |
| 8,487,378 B2 | 7/2013 | Goto et al. | |
| 8,497,177 B1 | 7/2013 | Chang et al. | |
| 8,497,528 B2 | 7/2013 | Lee et al. | |
| 8,609,518 B2 | 12/2013 | Wann et al. | |
| 8,610,240 B2 | 12/2013 | Lee et al. | |
| 8,618,556 B2 | 12/2013 | Wu et al. | |
| 8,633,516 B1 | 1/2014 | Wu et al. | |
| 8,652,894 B2 | 2/2014 | Lin et al. | |
| 8,680,576 B2 | 3/2014 | Ching et al. | |
| 8,686,516 B2 | 4/2014 | Chen et al. | |
| 8,703,565 B2 | 4/2014 | Chang et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,993 B2 | 5/2014 | Lo et al. | |
| 8,736,056 B2 | 5/2014 | Lee et al. | |
| 8,742,509 B2 | 6/2014 | Lee et al. | |
| 8,772,109 B2 | 7/2014 | Colinge | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,826,213 B1 | 9/2014 | Ho et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,887,106 B2 | 11/2014 | Ho et al. | |
| 9,105,490 B2 | 8/2015 | Wang et al. | |
| 2004/0065917 A1* | 4/2004 | Fan | H01L 27/11521 257/315 |
| 2006/0170058 A1* | 8/2006 | Chiang | H01L 21/0212 257/369 |
| 2007/0272275 A1* | 11/2007 | Wu | G03F 7/426 134/19 |
| 2010/0105179 A1* | 4/2010 | Jung | H01L 29/66825 438/261 |
| 2011/0068407 A1 | 3/2011 | Yeh et al. | |
| 2013/0011983 A1 | 1/2013 | Tsai et al. | |
| 2013/0285153 A1 | 10/2013 | Lee et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0183600 A1 | 7/2014 | Huang et al. | |
| 2014/0252412 A1 | 9/2014 | Tsai et al. | |
| 2014/0264590 A1 | 9/2014 | Yu et al. | |
| 2014/0264592 A1 | 9/2014 | Oxland et al. | |
| 2014/0282326 A1 | 9/2014 | Chen et al. | |
| 2015/0221654 A1* | 8/2015 | Kim | H01L 21/82387 257/77 |
| 2015/0263003 A1 | 9/2015 | Lee et al. | |
| 2016/0005756 A1* | 1/2016 | Chuang | H01L 27/11573 257/326 |

* cited by examiner

SURFACE TOPOGRAPHY BY FORMING SPACER-LIKE COMPONENTS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. However, conventional semiconductor device fabrication may still have certain drawbacks. For example, semiconductor device fabrication may involve topography variations. For example, some regions of the wafer may be "taller" or "shorter" than other regions of the wafer. The topography variations may lead to degraded device performance or even device failures. Conventional semiconductor fabrication methods have not provided a satisfactory solution to the topography variation problem. Therefore, while existing semiconductor devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

Figure 1:
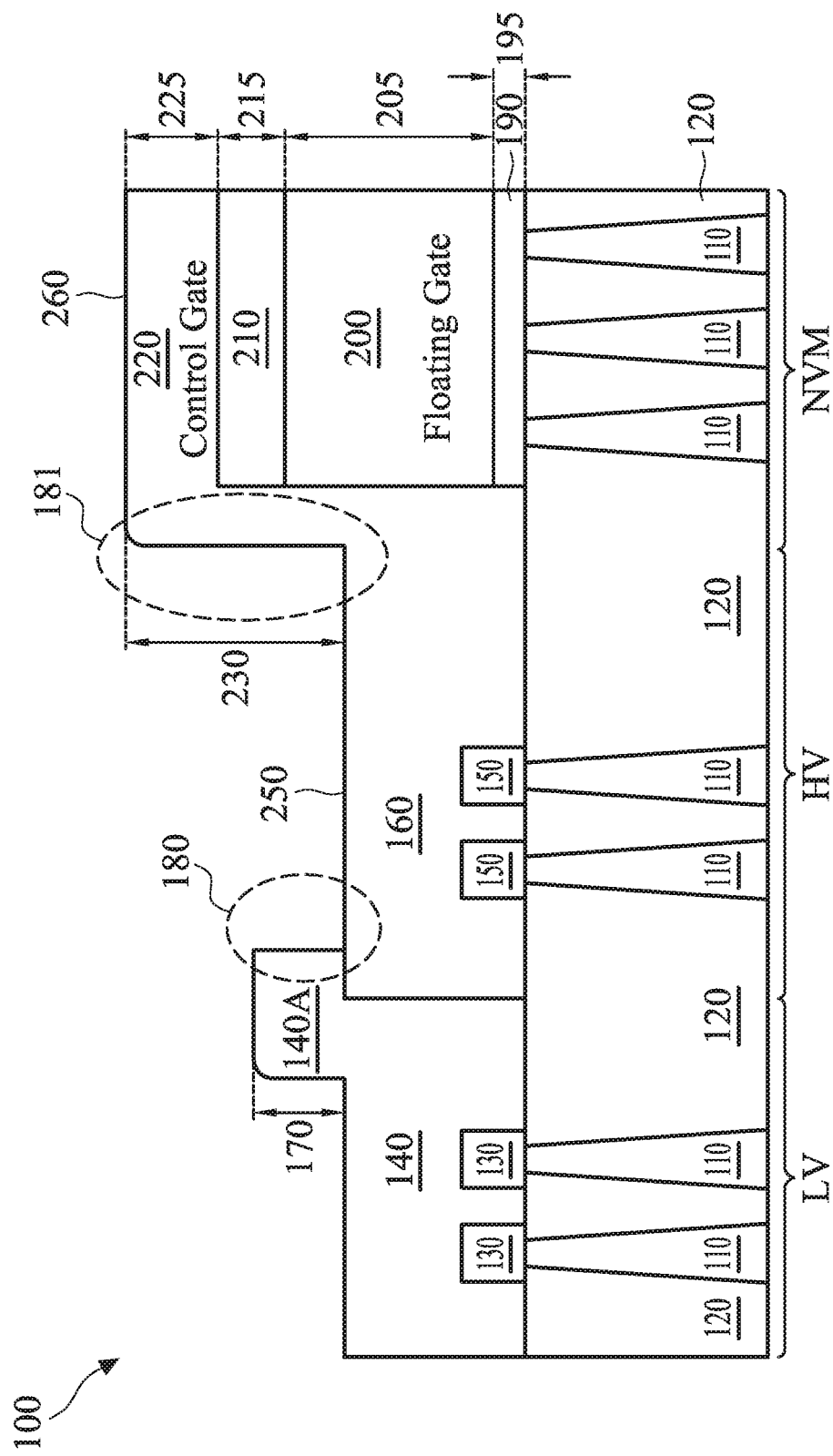
FIGS. 1 and 3-10 are cross-sectional side views of a semiconductor device at different stages of fabrication according to various embodiments of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As semiconductor device sizes keep on shrinking with each technology generation, new fabrication challenges continue to arise. One of the challenges pertains to topography variations in semiconductor fabrication. Topography variations may occur when some regions of a wafer may be "taller" (e.g., have a greater vertical height) than some other regions of the wafer, or vice versa. The "taller" or "shorter" regions may include different layers, such as semiconductor layers, dielectric layers, or conductive (e.g., metal) layers. Topography variations may not be an important concern in older technology generations, since the device sizes for the older technology generations either exceed the topography variations, or at least are big enough in comparison to the topography variations, such that the topography variations are unlikely to cause any problems. As such, conventional semiconductor fabrication methods have not devised a solution to address any potential problems that could be caused by the topography variations.

Unfortunately, as the semiconductor fabrication technology node has progressed to the nanometer (nm) nodes (e.g., 22-nm or below), topography variations may cause problems. For example, if a wafer's surface topography variation is not flat or smooth but rather contains a first region that is taller than a second region, then a layer formed on both the first region and the second region may "break" or experience a discontinuity. In other words, the layer may become damaged as a result of being formed over an uneven surface or terrain. The damaged layer may also lead to problems in subsequent fabrication processes, for example over-etching of layers that should not be etched, etc. Consequently, device performance may be degraded, and device failures may even occur in some instances.

The inventors of the present disclosure have discovered the potential problems caused by topography variations as a part of semiconductor device fabrication. Accordingly, the present disclosure pertains to a method of overcoming these potential problems, for example by "smoothing over" the topography variations. Certain various aspects of the present disclosure will be discussed in more detail below using a flash memory device as an example device in which the topography variations may occur, and a solution according to the various aspects of the present disclosure is implemented. However, it is understood that the flash memory device is merely an example, and various aspects of the present disclosure may apply to other types of devices as well.

Referring now to FIG. 1, a simplified diagrammatic fragmentary cross-sectional side view of a portion of a memory device 100 is illustrated. In some embodiments, the memory device 100 includes a flash memory device, which is a form of electronically erasable programmable read-only memory (EEPROM). A flash memory device may include a plurality of blocks or arrays or individual cells that contain NAND logic gates or NOR logic gates. In addition to being capable of storing electronically erasable data, some other advantages of flash memory devices include their relatively fast access times, mechanical shock resistance, and non-volatility. Due at least in part to these advantages, flash memory devices have been widely used in many consumer and professional products, for example memory cards, USB (Universal Serial Bus) flash drives, solid-state drives, personal computers (including desktops and/or laptops), digital cameras, mobile telephones, tablet computers, video games, robotics, and medical devices, etc.

For reasons of simplicity, merely a small portion of the memory device 100 is shown in FIG. 1. As shown in FIG. 1, the memory device 100 includes a plurality of active regions 110 (also referred to as OD). The active region 110 may be formed over a substrate, for example a silicon substrate. The active region 110 may include one or more doped wells, which may be formed using one or more ion implantation processes that implant dopant ions into the substrate. The dopant ions may include an n-type material in some embodiments, for example arsenic (As) or phosphorous (P), or they may include a p-type material in some other embodiments, for example boron (B), depending on whether an NFET or a PFET is needed. In some embodiments, the active regions 110 may each have a lateral dimension that is in a range between about 50 nm and about 200 nm. It is understood that portions of the active regions 110 may serve as the source/drain regions for a transistor, and other portions of the active regions 110 may serve as the channel regions for a transistor.

The memory device 100 also includes an isolation structure 120. The isolation structure 120 may also be formed over the substrate, for example by etching recesses in the substrate and then filling the etched recesses with a dielectric material. The isolation structure 120 is adjacent to and surrounds the active regions 110. In some embodiments, the isolation structure 120 includes shallow trench isolation (STI). The isolation structure 120 provides electrical isolation between various components of the memory device 100, for example including, but not limited to, the active regions 110.

As is shown in FIG. 1, the memory device 100 includes a low voltage region (LV), a high voltage region (HV), and a non-volatile memory region (NVM). In some embodiments, the NVM region includes a non-volatile memory device such as flash memory, while neither the LV region nor the HV region contains any non-volatile memory devices.

In the LV region, a gate dielectric 130 is disposed over each of the active regions 110, respectively. The gate dielectric 130 may serve as the gate dielectric of transistors for the LV region. In some embodiments, the gate dielectric 150 may include silicon oxide ($SiO_2$). In other embodiments, the gate dielectric 150 may include a high-k dielectric material, which is a material having a dielectric constant that is greater than a dielectric constant of $SiO_2$ (approximately 4). In an embodiment, the high-k gate dielectric includes hafnium oxide ($HfO_2$), which has a dielectric constant that is in a range from approximately 18 to approximately 40. In alternative embodiments, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO.

A gate electrode 140 is formed over the gate dielectric 130 in the LV region. The gate electrode 140 may serve as the gate electrode of the transistors for the LV region. In some embodiments, the gate electrode 140 may include polysilicon. In some other embodiments, the gate electrode 140 may include a metal gate electrode. The metal gate electrode may include a work function metal component and a fill metal component. The work functional metal component is configured to tune a work function of its corresponding transistor to achieve a desired threshold voltage Vt. In various embodiments, the work function metal component may contain: titanium (Ti), titanium aluminum (TiAl), titanium aluminum nitride (TiAlN), tantalum (Ta), tantalum carbide (TaC), tantalum carbon nitride (TaCN), tantalum silicon nitride (TaSiN), tantalum nitride (TaN), titanium nitride (TiN), tungsten nitride (WN), or tungsten (W), cobalt (Co), nickel (Ni), manganese (Mn), zirconium (Zr), or combinations thereof. The fill metal component is configured to serve as the main conductive portion of the gate structure. In various embodiments, the fill metal component may contain aluminum (Al), tungsten, copper (Cu), aluminum copper (AlCu), or combinations thereof.

For the HV region, a gate dielectric 150 is disposed over each of the active regions 110, respectively. The gate dielectric 150 may serve as the gate dielectric of the transistors for the HV region. Similar to the gate dielectric 130, the gate dielectric 150 may include silicon oxide or a high-k dielectric material.

A gate electrode 160 is formed over the gate dielectric 150 in the HV region. The gate electrode 160 may serve as the gate electrode of the transistors for the HV region. Similar to the gate electrode 140, the gate electrode 160 may include a polysilicon material or metal gate material.

One difference between the LV region and the HV region is that the transistors in the LV region and in the HV region are configured to handle different voltages. For example, the transistor in the LV region may be configured to handle a voltage in a range between about 0.5 volts and about 5 volts, whereas the transistors in the HV regions may be configured to handle a voltage in a range between about 5 volts and about several tens of volts, for example 20 volts. In order for the transistors in the HV region to properly handle the higher voltage, they may have a greater thickness for the gate dielectric 150 than the gate dielectric 130 in the LV region.

Note also that a portion 140A of the gate electrode 140 is formed over a portion of the gate electrode 160. As such, a step height 170 exists between the LV region and the HV region. The step height 170 is determined by the thickness of the portion 140A of the gate electrode 140 located over the gate electrode 160. In some embodiments, the step height 170 is in a range between about 20 nm and about 400 nm. It may be said that a topography variation 180 exists between the LV region and the HV region for the semiconductor device 100 due to the step height 170. As will be discussed in more detail below, the topography variation 180 between the LV region and the HV region may lead to problems in subsequent fabrication processes. As such, the present disclosure provides a solution to overcome the problems caused by the topography variation, as will be discussed below in more detail.

Still referring to FIG. 1, a tunnel oxide layer 190 is formed over the active regions 110 and the isolation structure 120 in the NVM region. Charge carriers may be moved through the tunnel oxide 190 via mechanisms such as Polyoxide Conduction, CHEI (Channel hot electron injection), and the high electric field Fowler-Nordheim tunneling. The tunnel oxide layer 190 has a thickness 195. In some embodiments, the thickness 195 is in a range between about 5 nm and about 50 nm.

For the NVM region, a floating gate component 200 is formed over the tunnel oxide layer 190. In some embodiments, the floating gate component 200 includes a semiconductor material such as polysilicon. The floating gate component 200 is formed to have a thickness 205. In some embodiments, the thickness 205 is in a range between about 20 nm and about 400 nm.

A dielectric structure 210 is formed over the floating gate component 200. In some embodiments, the dielectric structure 210 includes an "ONO" structure with an oxide component, a nitride component, and another oxide component. For example, the ONO structure may include a first silicon oxide layer formed over the floating gate component 200, and a silicon nitride layer formed over the silicon nitride layer, and a second silicon oxide layer formed over the silicon nitride layer. In other embodiments, the dielectric structure 210 may include a silicon nitride layer and a silicon oxide layer, but not two silicon oxide layers. The dielectric structure 210 is formed to have a thickness 215. In some embodiments, the thickness 215 is in a range between about 10 nm and about 60 nm.

A control gate component 220 is formed over the dielectric structure 210. In some embodiments, the control gate component 220 includes a semiconductor material such as polysilicon. In some embodiments, the control gate component 220 includes the same materials as the gate electrode 160 formed in the HV region, and they may be formed simultaneously using the same deposition processes. The control gate component 220 is formed to have a thickness 225. In some embodiments, the thickness 225 is in a range between about 20 nm and about 400 nm.

It is understood that the ranges of the thicknesses 195, 205, 215, and 225 may all contribute to a step height 230 at a boundary between the HV region and the NVM region. In some embodiments, the step height 230 may be measured as a distance from an upper surface 250 of the gate electrode 160 in the HV region to an upper surface 260 of the control gate component 220 in the NVM region. In some embodiments, the step height 230 is greater than the step height 170. For example, the step height 230 may be in a range between about 35 nm and about 510 nm.

Again, it may be said that a topography variation 181 exists at the boundary between the HV region and the NVM region for the semiconductor device 100 due to the step height 230. Since the step height 230 is greater than the step height 170, the topography variation between the HV region and the NVM region is even greater than the topography variation between the LV region and the HV region. As such, the semiconductor device 100 may experience even more problems caused by the greater topography variation between the HV region and the NVM region. Again, the present disclosure provides a solution to overcome the problems caused by such topography variation, as will be discussed below in more detail.

Figure 2:
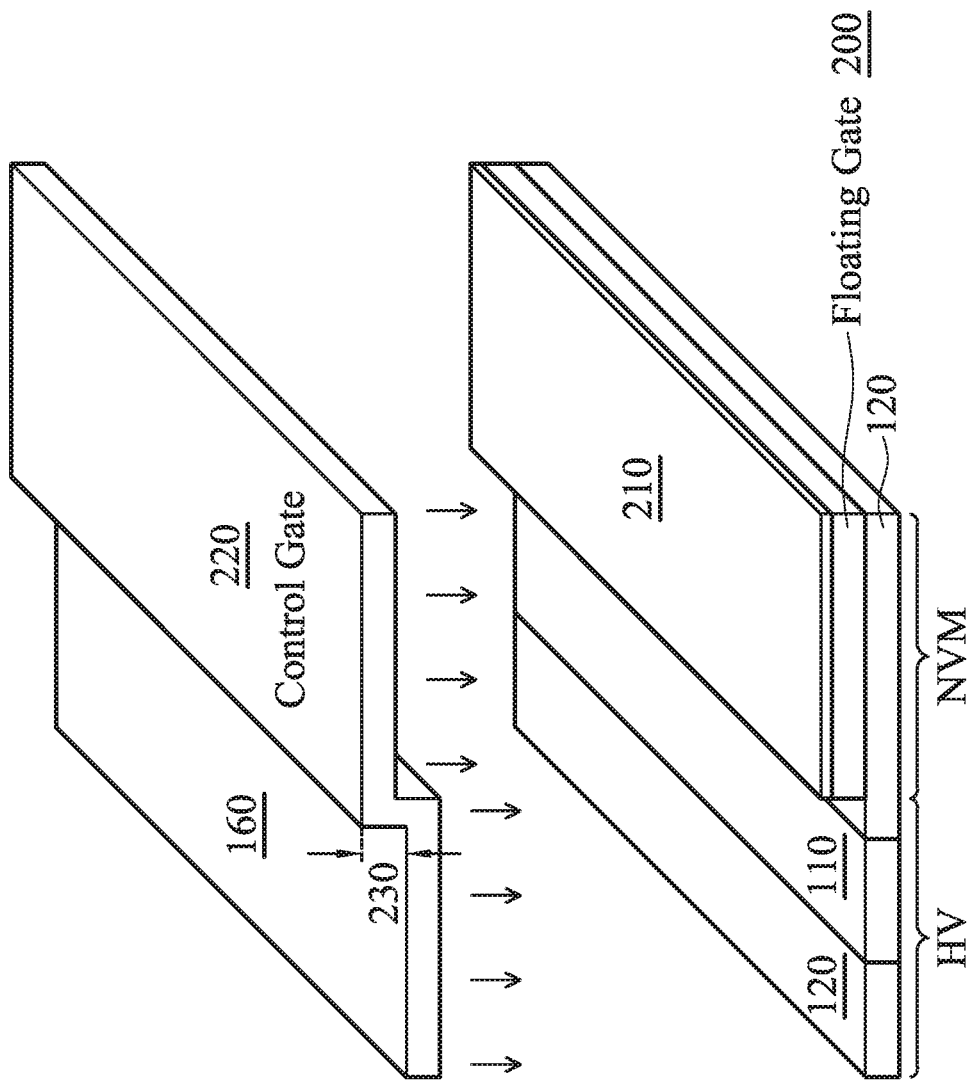
FIG. 2 is a three-dimensional perspective view of the semiconductor device at a stage of fabrication according to an embodiment of the present disclosure.

The topography variation between the HV region and the NVM is also illustrated in FIG. 2, which is a 3-dimensional perspective view of a portion of the memory device 100. A part of the HV region is illustrated in FIG. 2, as is a part of the NVM region. As shown in FIG. 2, the gate electrode 160 is formed over the active region 110 and the isolation structure 120 in the HV region, and the control gate component 220 is formed on the dielectric structure 210 (which may include an ONO structure) in the NVM region. In some embodiments, the gate electrode 160 and the control gate component 220 are connected and are formed as the same layer (or layers). Due to the presence of the floating gate component 200, the dielectric structure 210, (and the tunnel oxide layer 190, which is not specifically illustrated in FIG. 2 for reasons of simplicity) in the NVM region, the step height 230 exists between the boundary of the HV region and the NVM region. Again, the negative effects caused by this step height 230 will be minimized by various aspects of the present disclosure.

The operation of the memory device 100 is now briefly described. Referring to FIGS. 1-2, the floating gate component 200 is configured to store a bit by the presence or absence of an electrical charge. When the floating gate component 200 is not electrically charged (e.g., neutral), then the transistor in the NVM region function similar to a regular metal oxide field effect transistor (MOSFET). For example, a positive charge in the control gate component 220 would create a channel between a source and a drain (e.g., formed in the active regions). On the other hand, when the floating gate component 200 is negatively charged, the negative charge may shield what would have been the channel from the control gate component 220. As a result, the channel may not be formed between the source and the drain. The presence or the absence of a charge in the floating gate component 200 results in a more positive threshold voltage Vt or more a more negative threshold voltage Vt (where the threshold voltage Vt is voltage applied to the control gate component 220 at which the transistor becomes conductive). In this manner, the memory device may be programmed by injecting electrical charge into the floating gate component 200 or removing electrical charge from the floating gate component 200. For example, injecting electrical charge into the floating gate component 200 results in writing a logic 0 to a flash memory cell, and removing electrical charge from the floating gate component 200 results in resetting the flash memory cell to a logic 1.

Figure 3:
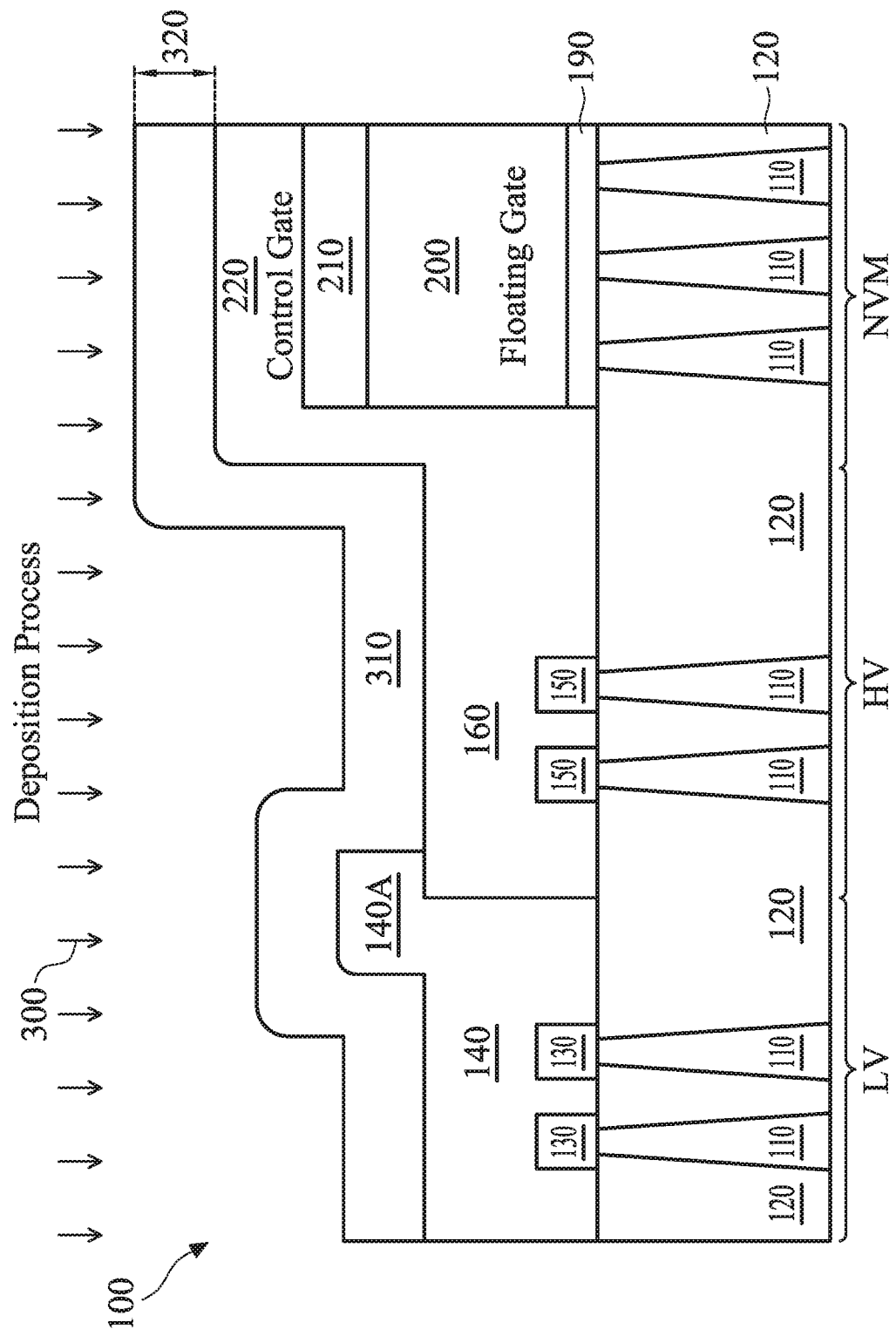

Referring now to FIG. 3, using a deposition process 300, a layer 310 is formed over the upper surface of the gate electrode 140 in the LV region, over the gate electrode 160 in the HV region, and over the control gate component 220 in the NVM region. In some embodiments, the deposition process 300 includes chemical vapor deposition (CVD), physical vapor deposition (PVD), atomic layer deposition (ALD), or combinations thereof. In some embodiments, the deposition process 300 may include a conformal deposition process, such that the layer 310 is formed conformally over the upper surfaces of the various components in the LV region, the HV region, and the NVM region. In other embodiments, the deposition process 300 may include a non-conformal deposition process as well.

In some embodiments, the layer 310 contains a dielectric material, for example a silicon oxide material. The silicon oxide material may include tetraethyl orthosilicate (also referred to as tetraethoxysilane, or abbreviated as TEOS). The layer 310 is also formed to have a thickness 320. In some embodiments, the thickness 320 is in a range from about 600 angstroms and about 1000 angstroms. As will be discussed in greater detail below, the layer 310 is used as a buffer layer or a transitional layer to "smooth over" the topography variations of the semiconductor device 100. In some embodiments, the range of values of the thickness 320 is specifically configured to facilitate the function served by the layer 310—which is to minimize the topography variation effects. In other words, if the value of the thickness 320 is too high or too low, then the layer 310 may not achieve a desired efficacy in terms of reducing the topography variations between the HV region and the NVM region.

Figure 4:
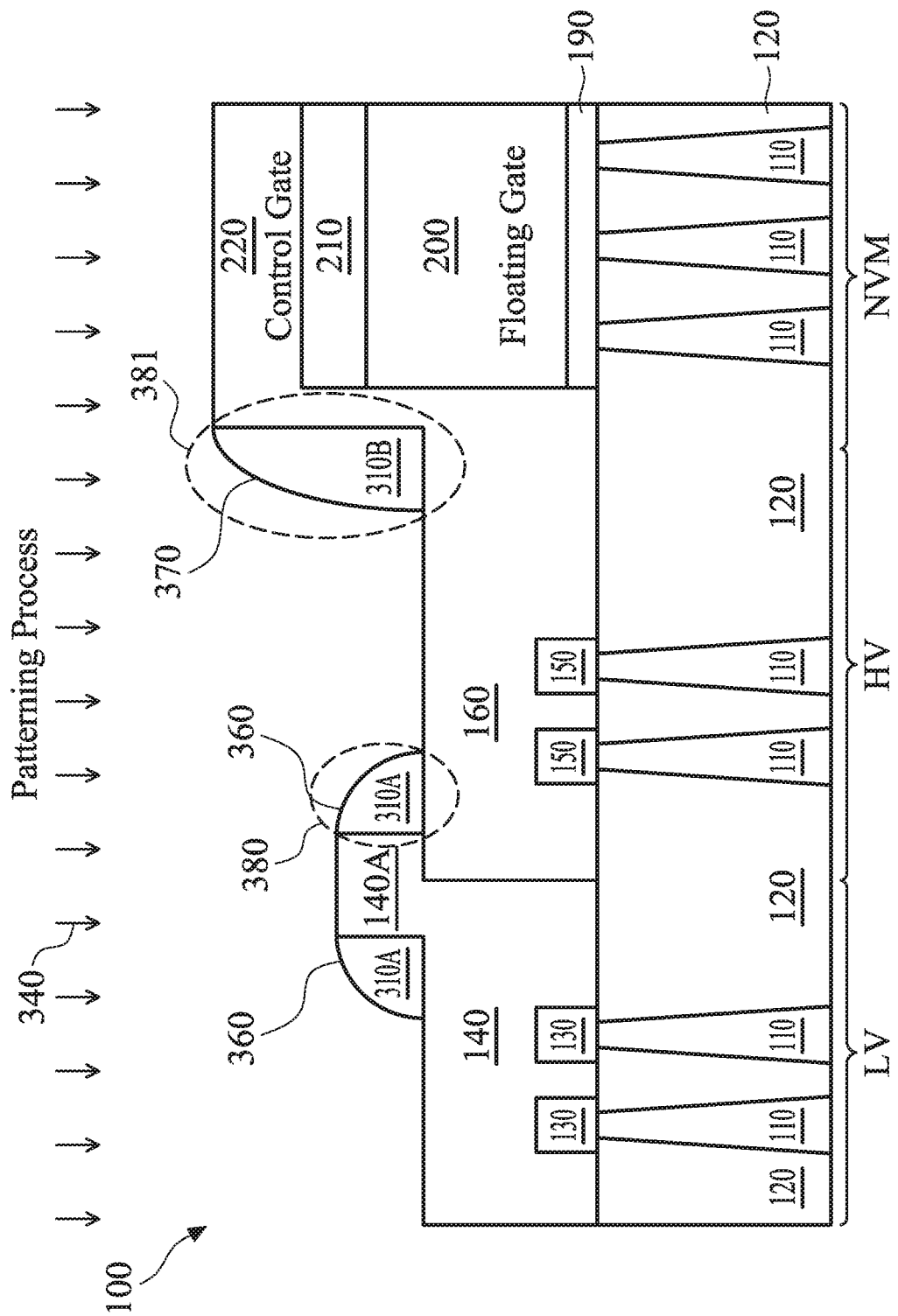

Referring now to FIG. 4, a patterning process 340 is performed to the layer 310 to pattern the layer 310 into components 310A that are formed on the sidewalls of the portion 140A of the gate electrode 140, as well as a component 310B formed on the sidewalls of the control gate component 220. In some embodiments, the patterning process 340 is similar to a spacer patterning process, which may include an etching process or a blanket etch-back process.

As a result of the patterning process 340 being performed, the components 310A and 310B are shaped similar to spacers. For example, the components 310A each have a somewhat rounded or curved surface 360, and the component 310B has a somewhat rounded or curved surface 370. The curved surfaces 360 and 370 effectively make the upper surface of the semiconductor device 100 more smooth or "flatter." For example, rather than having a relatively steep and abrupt drop off between the LV region and the HV region due to the step height 170 (see FIG. 1), the curved surface 360 of the spacer-like components 310A allow for a more gradual transition between the LV region and the HV region. In other words, the previous topography variation 180 (shown in FIG. 1) between the LV region and the HV region is reduced into a smoother topography variation 380.

Similarly, rather than having a relatively steep and abrupt drop off between the HV region and the NVM region due to the step height 230 (see FIG. 1), the curved surface 370 of the spacer-like component 310B allow for a more gradual transition between the HV region and the NVM region. In other words, the previous topography variation 181 (shown in FIG. 1) between the HV region and the NVM region is reduced into a smoother topography variation 381.

These more gradual transitions between the various regions of the semiconductor device 100 will reduce the likelihood of breakage of a layer to be formed subsequently (formed over the upper surfaces of the LV region, the HV region, and the NVM region).

Figure 5:
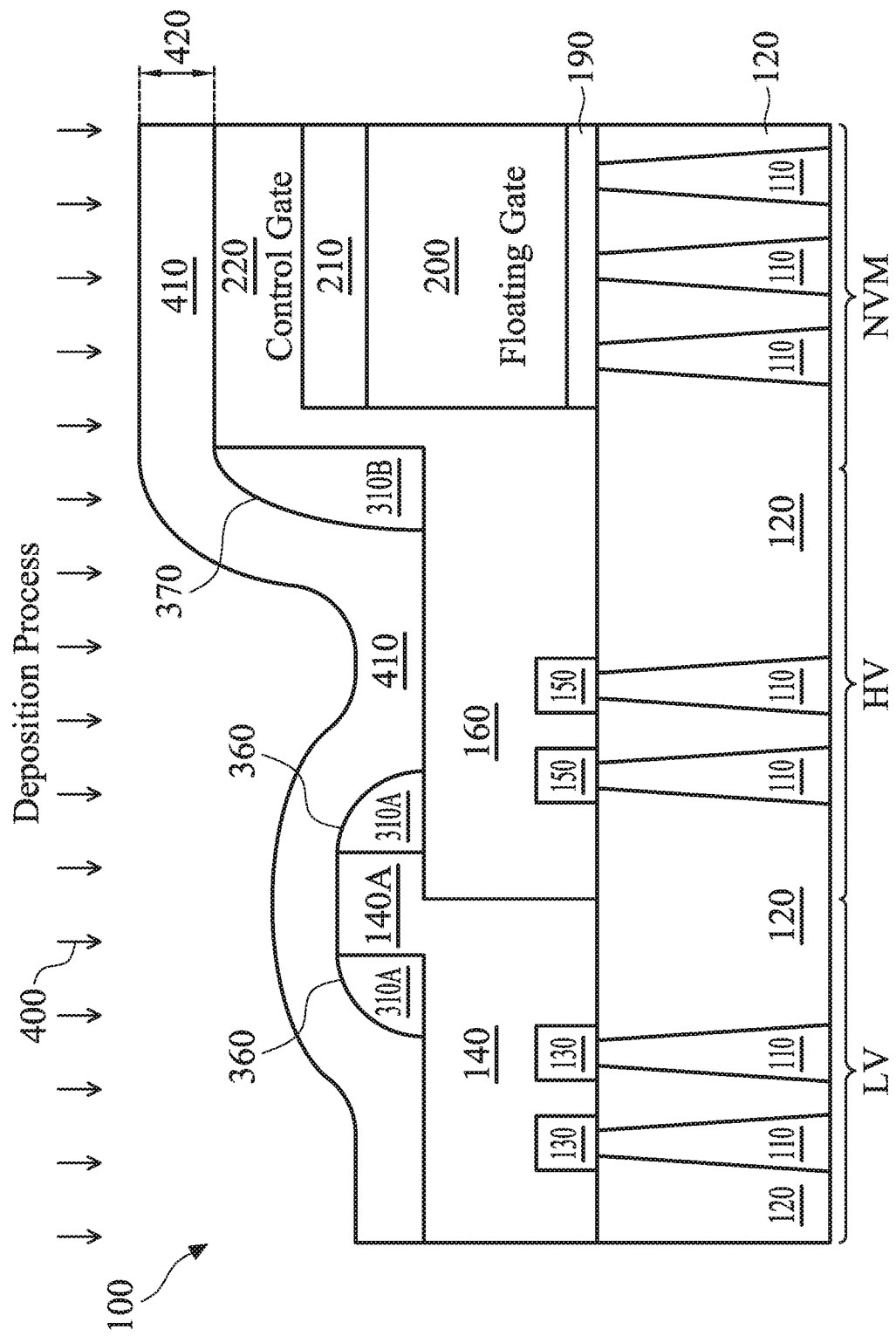

Referring now to FIG. 5, using a deposition process 400, a layer 410 is formed over the upper surface of the semiconductor device 100 in the LV region, the HV region, and the NVM region. The layer 410 is formed to have a thickness 420. In some embodiments, the thickness 420 is in a range between about 50 nm and about 200 nm.

The layer 410 may include a dielectric material, such as an ashing-removable dielectric (ARD) material. In some embodiments, the ARD material may include a material having photoresist-like properties. For example, the ARD material may be capable of being etched and/or patterned, similar to a photoresist material. Thus, whereas an ashing process may be used to remove the photoresist material, it may also remove the ARD material. As an example, the ARD material may be a strippable CVD-deposited hardmask film such as Applied Materials Incorporated's® Advanced Patterning Film, which is an amorphous carbon material that produces higher definition patterns. Since the ARD material has properties that allow it to be removed by ashing, it may be used as a disposable material, and is used temporarily during the fabrication process, before eventually being completely removed from the final semiconductor package. In the examples herein, the ARD material allows the layer 410 to be patterned as a mask layer, and then the patterned mask layer is then used to pattern the control gate component 220 in a later process.

In some embodiments, due to the unique characteristics of the ARD material of the layer 410, the deposition process 400 used to form the layer 410 may be a non-conformal deposition process. In other embodiments, the deposition process 400 may not be specifically configured to be a non-conformal deposition process, but if the step height 170 or the step height 230 is too great, then the result is that the layer 410 may still be deposited as a non-conformal layer. In any case, the layer 410 is deposited non-conformally over the upper surfaces of the various components in the LV region, the HV region, and the NVM region. If the spacer-like components 310A and 310B had not been formed, the non-conformal deposition of the layer 410, in conjunction with the topography variations of the semiconductor device 100 discussed above (e.g., caused by step heights 170 or 230), could cause problems in later fabrication processes.

Figure 6:
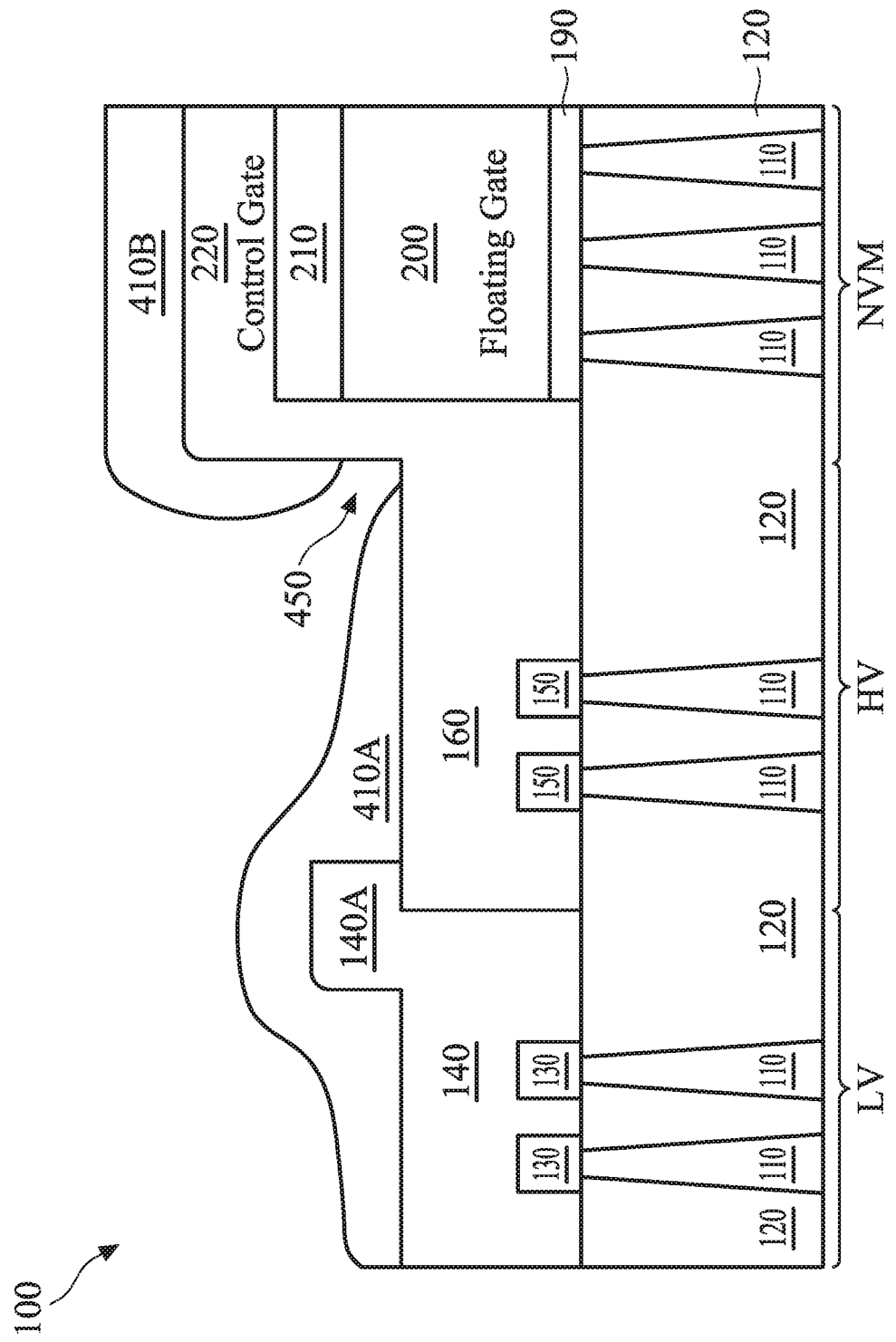

For example, referring to FIG. 6, which is a cross-sectional side view showing what the semiconductor device 100 could have looked like if the spacer-like components 310A and 310B had not been formed to smooth over the topography variations between the LV, HV, and NVM regions. In that case, the layer 410 deposited by the deposition process 400 may experience a "break" 450, for example between the HV region and the NVM region. In other words, due to the step height 230 (shown in FIG. 1) between the HV region and the NVM region, the non-conformal deposition process 400 may not be able to form a continuous layer 410. Instead, the layer 410 may "break", and portions of the layer 410 may be formed on an upper portion (but not the lower portion) of the sidewall of the control gate component 220. As such, the layer 410 is now discontinuous and includes a segment 410A formed over the LV region and the HV region, and a separate segment 410B formed over the NVM region.

The "breaking" of the layer 410 may cause problems later on, when the layer 410 is used to pattern the layers below. For example, the absence of the layer 410 in the "break" 450 means that the layer below may be undesirably etched, when it should have been protected by the layer 410. As another example, for some type of overlay marks, their boundaries may also correspond to the boundary between the HV region and the NVM region. As such, the breaking of the layer 410 may lead to a damage of the boundary of the overlay mark. As a result, overlay measurements may become inaccurate.

It is understood that although FIG. 6 merely illustrates one "break" 450 (which occurs between the HV region and the NVM region), other "breaks" of the layer 410 may also occur, for example at the boundary or interface between the LV region and the HV region, due to the step height 170 (shown in FIG. 1). When these additional breaks of the layer 410 occur, it may further compound the patterning problems in subsequent processes, as discussed above.

Figure 7:
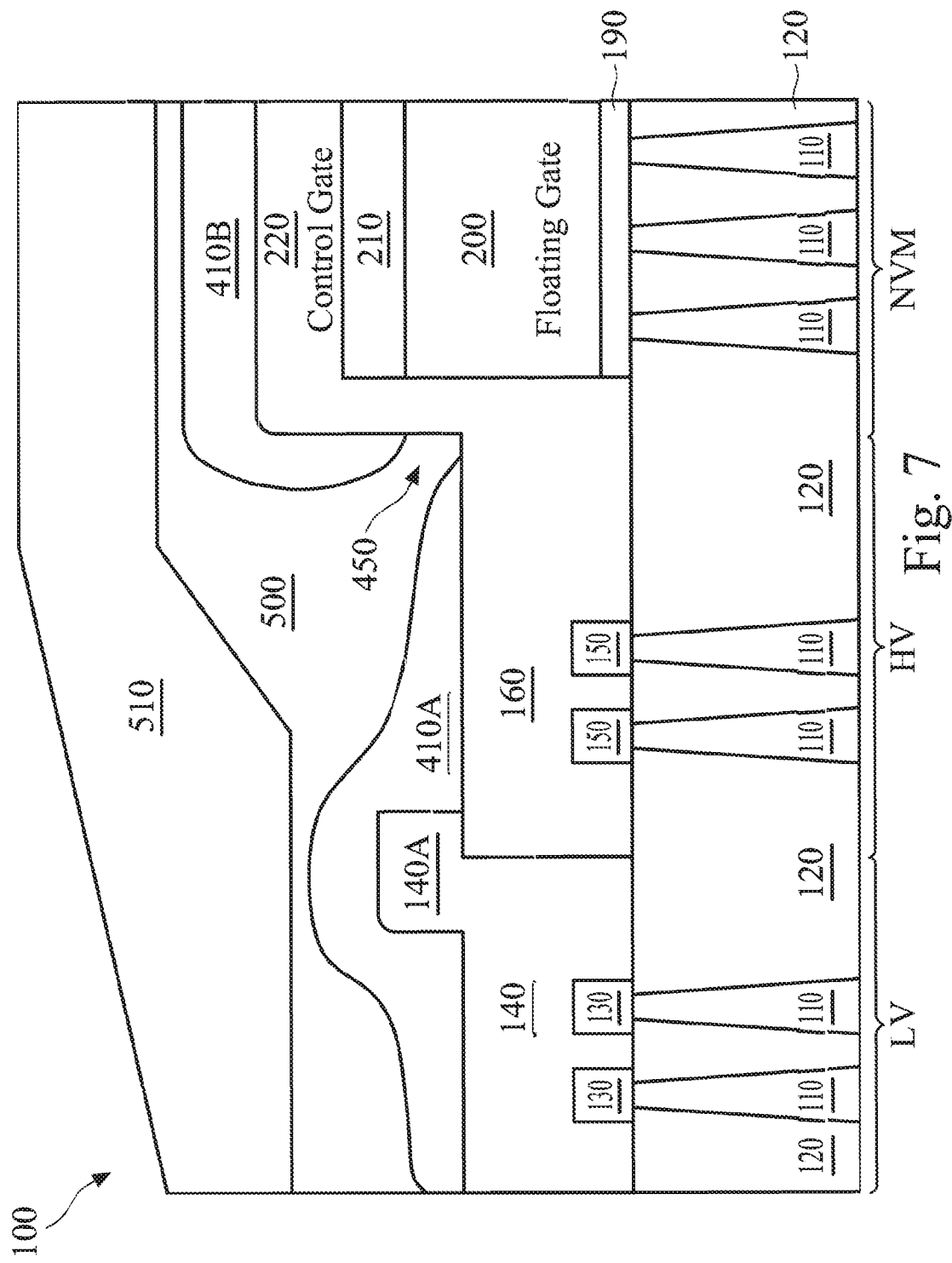
Figure 8:
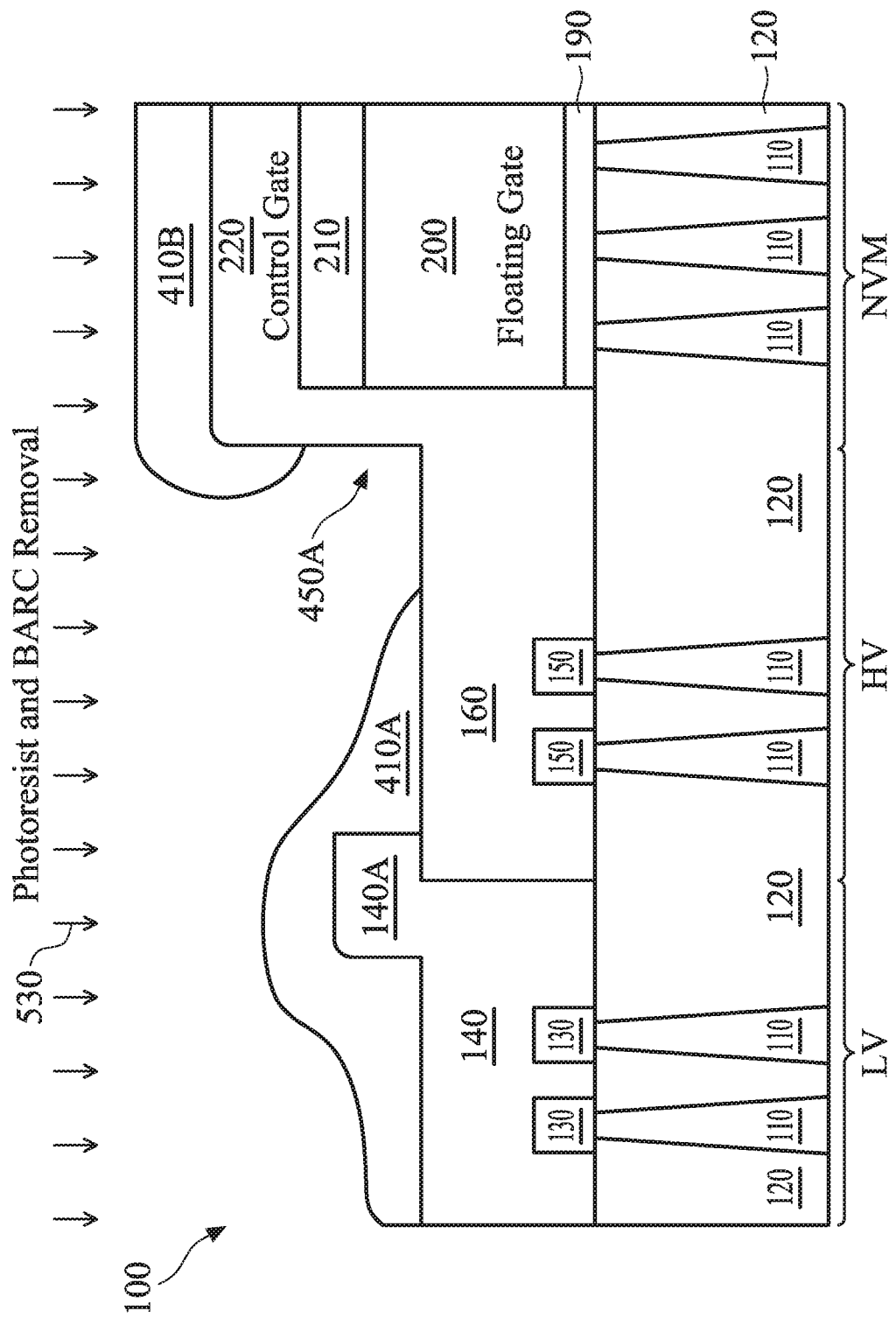
Figure 9:
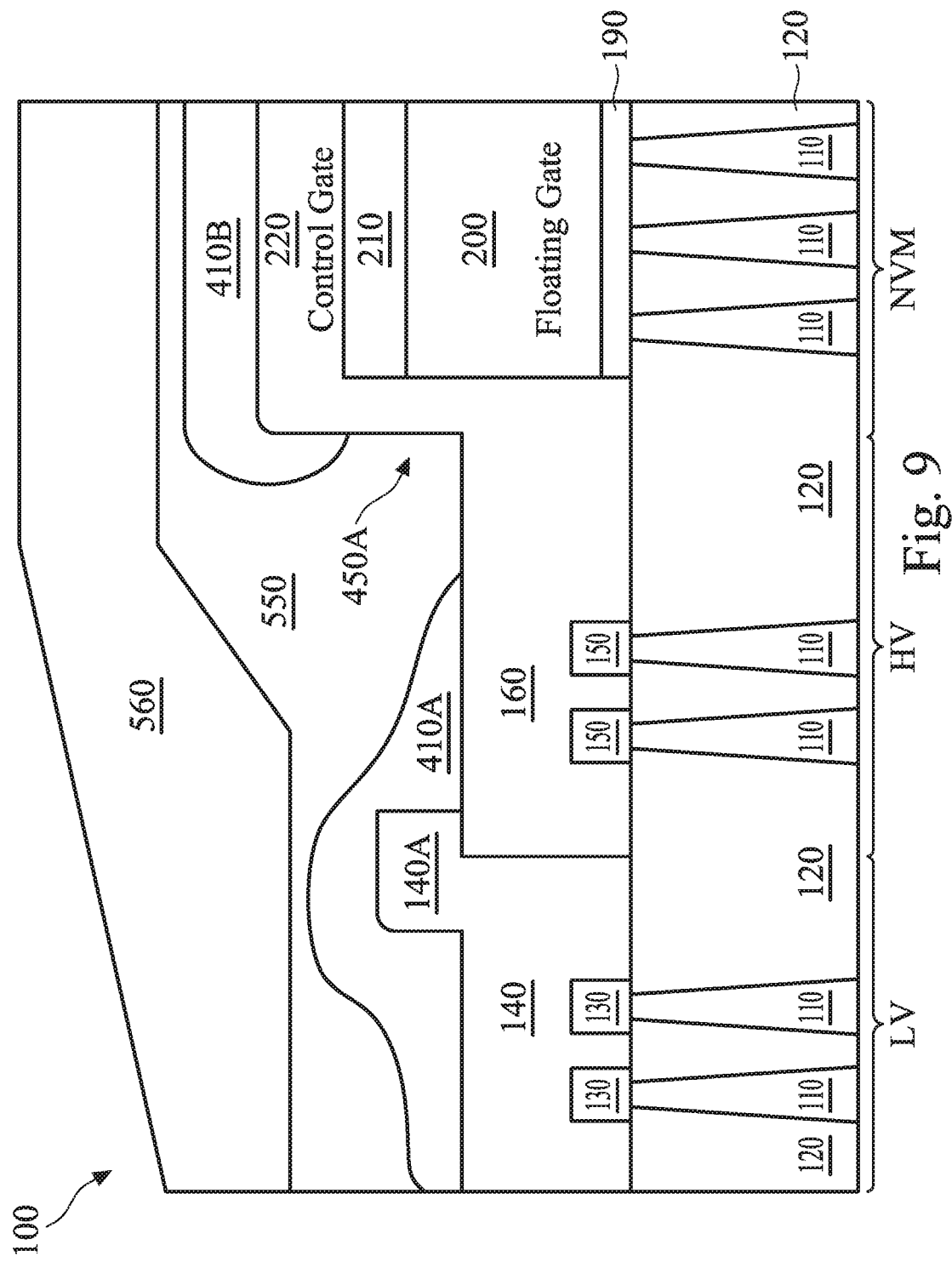

Making matters worse, the break 450 (or other similar breaks) may be exacerbated by some subsequent processes, such as during a photoresist rework process. This is shown in FIGS. 7-9. Referring to FIG. 7, in order to pattern the layer 410 into a mask layer, a bottom anti-reflective coating (BARC) layer 500 is formed over the layer 410, and a photoresist layer 510 is formed over the BARC layer 500. The photoresist layer 510 and the BARC layer 500 may undergo a photolithography process to define the photoresist layer 510 and the BARC layer 500, so that they can be used to pattern the layer 410 later.

Referring now to FIG. 8, a photoresist and BARC removal process 530 is applied as a part of the photoresist rework process. In some cases, after the initial patterning of the photoresist layer 510 and the BARC layer 500, measurements may reveal that the initial patterning of the photoresist layer and the BARC layer 500 may be unsatisfactory. This could be due to inadequate critical dimension (CD) or poor overlay, for example. As such, the photoresist needs to be "reworked", for example by removing the existing photoresist layer 510 and the BARC layer 500, and forming a new photoresist layer and a BARC layer. The photoresist and BARC removal process 530 may remove the photoresist layer 510 by photoresist washing, and it may remove the BARC layer 500 by applying an acid to remove the BARC layer 500. In some embodiments, the acid may include Peroxymonosulfuric acid (H2SO5), also known as Caro's acid. Unfortunately, the acid may also corrode or otherwise damage the layer 410 if the "broken" layer 410 has a large surface area that may be exposed to the acid. Thus, the photoresist rework process could undesirably enlarge an already-existing "break" 450 into a larger "break" 450A, as shown in FIG. 8.

Referring now to FIG. 9, as a part of the photoresist rework process, another BARC layer 550 and another photoresist layer 560 are formed over the layer 410. The photoresist layer 560 and the BARC layer 550 will undergo lithography to be patterned, which in turn can be used to pattern the layer 410 below. However, the "break" 450A—which was made larger by the acid used to remove the BARC layer 550—still exists, and it may cause damage to other layers in subsequent fabrication processes.

Referring back to FIG. 5, since the present disclosure uses the spacer-like components 310A and 310B to effectively reduce the step height and thereby make the topography smoother between the LV, HV, and NVM regions, the layer 410 may not be broken even though it is deposited non-conformally. Furthermore, even if the semiconductor device 100 needs a photoresist rework at some point, the layer 410—which is still formed as a continuous layer due to the presence of the spacer-like components 310A and 310B—will not be damaged due to the application of the acid used to remove the BARC layer. For these reasons, the potential problems discussed above with reference to FIGS. 7-9 are unlikely to occur. As such, the method of the present disclosure discussed herein will improve semiconductor fabrication performance.

Figure 10:
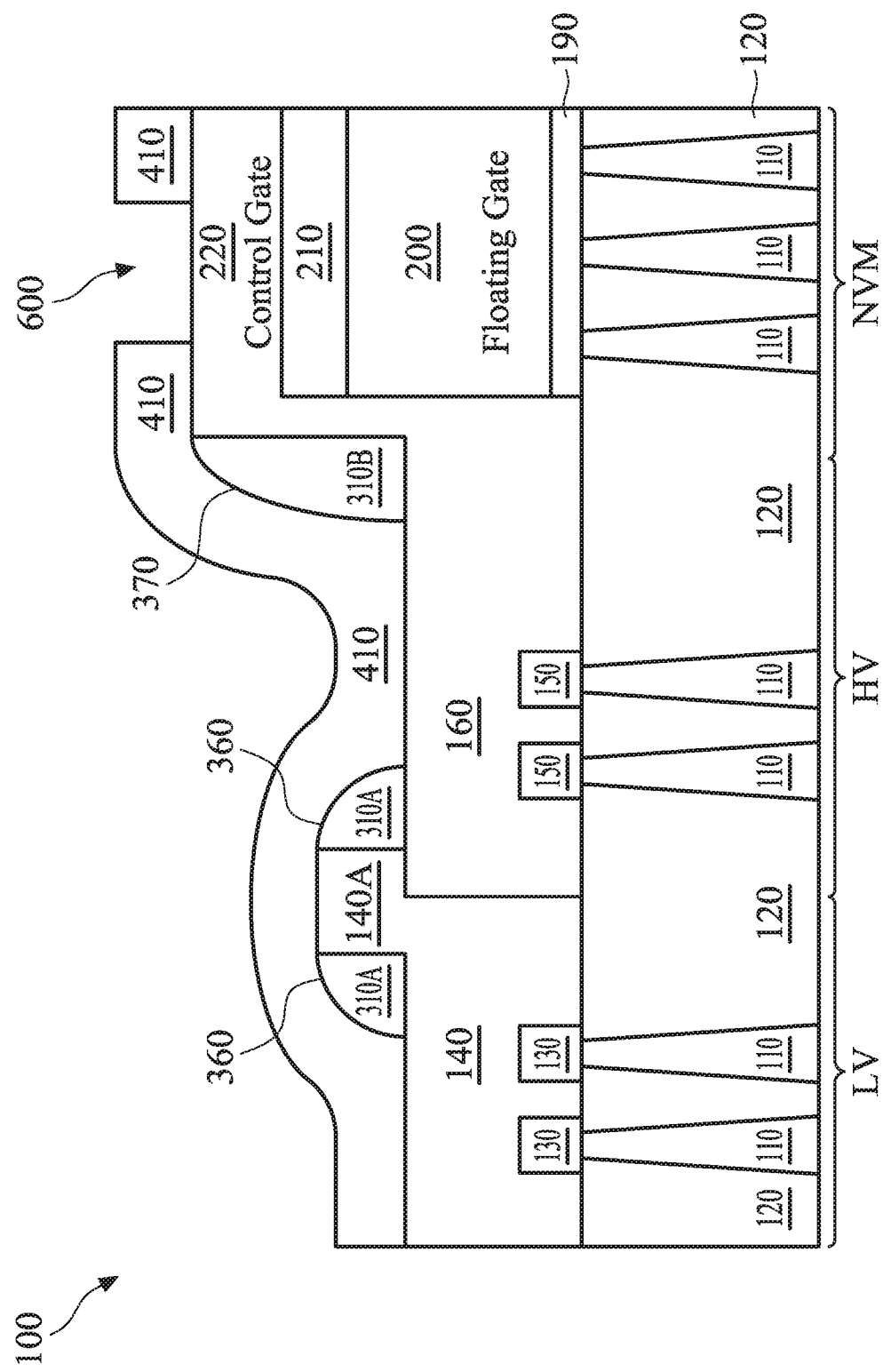

Referring now to FIG. 10, the layer 410 is shown as having been patterned by a photo-sensitive material (e.g., the photoresist layer and the BARC layer discussed above). The patterned layer 410 may include one or more openings, such as an opening 600 that exposes a portion of the control gate component 220. In other words, in the embodiment illustrated in FIG. 10, the patterned layer 410 may be used to pattern the gate structure of the transistor in the NVM region. In other embodiments, the layer 410 may be patterned differently to pattern other structures, for example the gate structures of the transistors in the LV region or the HV region.

Figure 11:
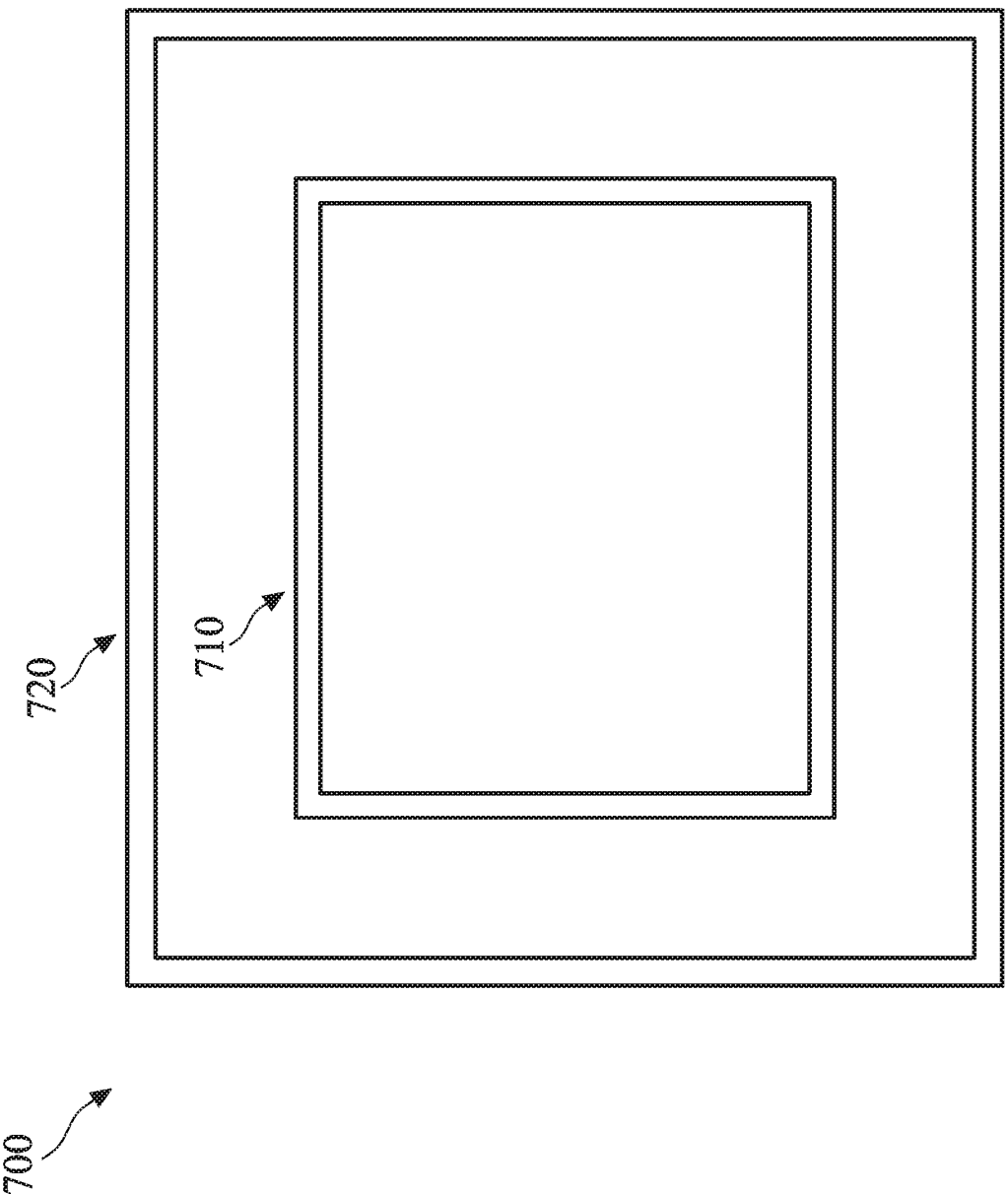
FIG. 11 is a top view of an overlay mark according to an embodiment of the present disclosure.

FIG. 11 illustrates a simplified top view of an overlay mark 700. The overlay mark 700 may be formed on the wafer on which the semiconductor device 100 discussed above is formed. The overlay mark 700 may also be considered to be a part of the semiconductor device 100. In the illustrated embodiment, the overlay mark 700 has a box-in-box structure, with an inner box 710 and an outer box 720. The location of the inner box 710 or the outer box 720 may correspond to a location of the semiconductor device 100 where a step height exists. For example, in some embodiments, the inner box 710 or the outer box 720 may correspond to the boundary between the HV region and the NVM region discussed above. If the spacer-like components 310A-310B of the present disclosure had not been formed to "smooth over" the step height, the breaking of the ARD layer may cause damage to the inner box 710, or the outer box 720, or both. This could degrade the overlay performance and cause the overlay measurements based on the overlay mark 700 to become unreliable. Fortunately, this is no longer an issue according to the various aspects of the present disclosure, since the spacer-like components lead to a smoother topography for the overlay mark 700 as well, and it can be fabricated without being damaged.

Figure 12:
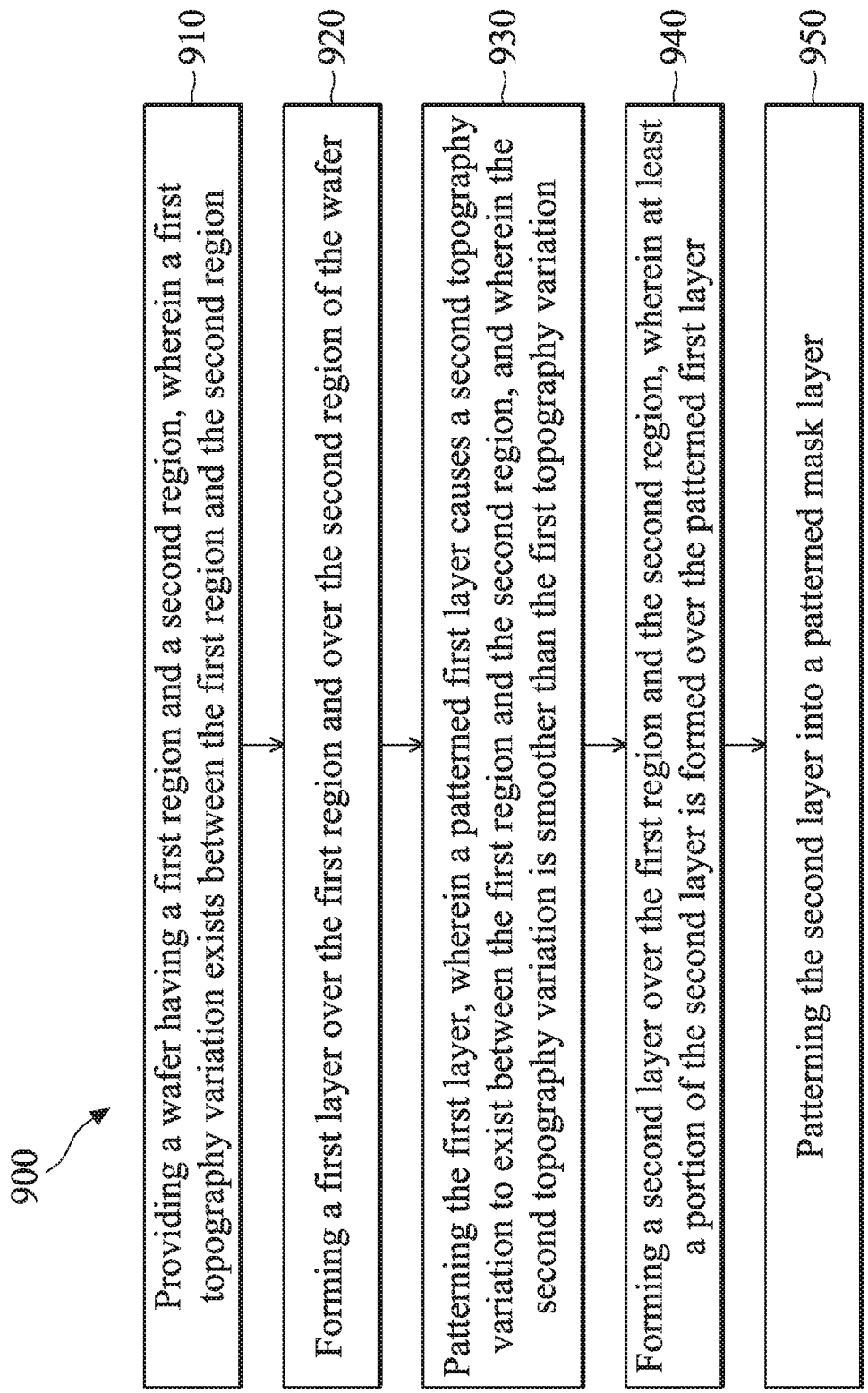
FIG. 12 is a flowchart of a method for fabricating a semiconductor device in accordance with embodiments of the present disclosure.

FIG. 12 is a flowchart of a method 900 for fabricating a semiconductor device in accordance with various aspects of the present disclosure. The method 900 includes a step 910 of providing a wafer having a first region and a second region. A first topography variation exists between the first region and the second region. In some embodiments, the semiconductor device includes a memory device. In some embodiments, the first region includes a non-volatile memory device. In some embodiments, the second region does not have a non-volatile memory device. In some embodiments, the first region is taller than the second region. In some embodiments, the non-volatile memory device includes a floating gate and a control gate formed over the floating gate.

In some embodiments, the method 900 includes a step 920 of forming a first layer over the first region and over the second region of the wafer.

In some embodiments, the method 900 includes a step 930 of patterning the first layer. A patterned first layer causes a second topography variation to exist between the first region and the second region. The second topography variation is smoother than the first topography variation. In some embodiments, the patterning of the first layer includes a spacer patterning process.

In some embodiments, the method 900 includes a step 940 of forming a second layer over the first region and the second region. At least a portion of the second layer is formed over the patterned first layer. In some embodiments, the forming of the second layer is performed using a non-conformal deposition process. In some embodiments, the forming of the second layer comprises forming the second layer as a continuous layer.

In some embodiments, the method 900 includes a step 950 of patterning the second layer into a patterned mask layer. In some embodiments, the patterning of the second layer comprises a photoresist rework process. In some embodiments, the patterning of the second layer comprises forming an anti-reflective material over the second layer and forming a photo-sensitive material over the anti-reflective material. In some embodiments, the photoresist rework process comprises applying an acid to remove the anti-reflective material. In some embodiments, the patterning of the second layer comprises forming the patterned second layer on a sidewall of the control gate.

It is understood that additional process steps may be performed before, during, or after the steps 910-950 discussed above to complete the fabrication of the semiconductor device. For example, these additional steps may include contact formation, testing, packaging, etc. For reasons of simplicity, these additional steps are not discussed in detail herein.

Based on the above discussions, it can be seen that the present disclosure offers advantages over conventional semiconductor fabrication methods. It is understood, however, that other embodiments may offer additional advantages, and not all advantages are necessarily disclosed herein, and that no particular advantage is required for all embodiments. One advantage is that, due to the spacer-like components formed herein at the boundaries of regions where a step height exists, the device of the present disclosure can achieve a much smoother surface topography. This reduces the likelihood of breakage of subsequent layers (e.g., an ARD layer) formed on the surface. Since the layer is not broken, it will not cause damage to other layers (e.g., the layers to be patterned below) during subsequent fabrication processes. Consequently, semiconductor device performance (e.g., overlay performance) is enhanced, and yield may be improved. This is especially true if a photoresist rework process would need to be performed. During the photoresist rework process, an acid may be applied to remove the BARC layer, and that acid could enlarge a discontinuity of the ARD layer, if that discontinuity already exists as a result of the uneven surface topography. Here, since the ARD layer is formed as a continuous layer (due to the smoother surface topography), the acid applied as a part of the photoresist rework process would still not exacerbate the damage to the ARD layer. In addition, the various aspects of the present disclosure are compatible with current fabrication process flow and are easy to implement, and therefore inexpensive to implement in actual fabrication.

One embodiment of the present disclosure involves a method of fabricating a semiconductor device. The method includes: providing a wafer having a first region and a second region, wherein a first topography variation exists between the first region and the second region; forming a first layer over the first region and over the second region of the wafer; patterning the first layer, wherein a patterned first layer causes a second topography variation to exist between the first region and the second region, and wherein the second topography variation is smoother than the first topography variation; and forming a second layer over the first region and the second region, wherein at least a portion of the second layer is formed over the patterned first layer.

Another embodiment of the present disclosure involves a method of fabricating a semiconductor device. The method includes: providing a wafer having a first region and a second region, wherein the first region includes a flash memory cell and is taller than the second region; forming a first layer over the first region and over the second region of the wafer; patterning the first layer to form a spacer component at a boundary between the first region and the second region; and forming a continuous second layer over the first region and over the second region, including over the spacer component.

Yet another embodiment of the present disclosure involves a method of fabricating a semiconductor device. The method includes: providing a wafer having a first device and a second device located adjacent to the first device, wherein the first device comprises a non-volatile memory device, and wherein a step height exists at a boundary between the non-volatile memory device and the second device; forming a component at the boundary, wherein the component provides a reduction in the step height between the non-volatile memory device and the second device; and forming, via a non-conformal deposition process, a mask layer over the non-volatile memory device and the second device, wherein the mask layer is formed to be continuous at least in part due to the component providing the reduction in the step height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
providing a wafer having a first region that includes a floating gate and a control gate formed over the floating gate, a second region disposed laterally with respect to the first region, and a third region disposed laterally with respect to the second region, wherein a first topography variation exists between the first region and the second region, and wherein a second topography variation exists between the second region and the third region;
forming a first layer over the first region, the second region, and the third region of the wafer;
patterning the first layer, wherein a patterned first layer causes a third topography variation to exist between the first region and the second region and a fourth topography variation to exist between the second region and the third region, and wherein the third topography variation is smoother than the first topography variation, and wherein the fourth topography variation is smoother than the second topography variation; and
forming a second layer over the first region and the second region such that the second layer is formed on a sidewall of the control gate but not a sidewall of the floating gate, wherein at least a portion of the second layer is formed over the patterned first layer.

2. The method of claim 1, further comprising patterning the second layer into a patterned mask layer.

3. The method of claim 2, wherein:
the patterning of the second layer comprises forming an anti-reflective material over the second layer and forming a photo-sensitive material over the anti-reflective material; and
applying an acid to remove the anti-reflective material.

4. The method of claim 1, wherein the forming of the second layer is performed using a non-conformal deposition process.

5. The method of claim 1, wherein the forming of the second layer comprises forming the second layer as a continuous layer.

6. The method of claim 1, wherein the patterning of the first layer includes forming a spacer.

7. The method of claim 1, wherein:
the semiconductor device includes a memory device;
the first region includes a non-volatile memory device; and
the second region does not have a non-volatile memory device.

8. The method of claim 7, wherein the first region is taller than the second region.

9. A method of fabricating a semiconductor device, comprising:
providing a wafer having a first region, a second region and a third region, wherein the first region includes a flash memory cell and is taller than the second region and the third region;
forming a first layer over the first region, the second region, and the third region of the wafer;
patterning the first layer to form a first spacer component at a boundary between the first region and the second region and to form a second spacer component at a boundary between the second region and the third region, thereby smoothing over topography variations between the first region, the second region, and the third region; and forming a continuous second layer over the first region, over the second region, and over the third region, including over the first spacer component and over the second spacer component, wherein a smoothing over of the topography variations provided by the first spacer component and the second spacer component reduces a breakage of the continuous second layer.

10. The method of claim 9, wherein:
the flash memory cell includes a floating gate and a control gate formed over the floating gate; and
the first spacer component is formed on a sidewall of the control gate but not on a sidewall of the floating gate.

11. The method of claim 9, wherein the forming of the second layer is performed via a non-conformal deposition process.

12. The method of claim 11, further comprising:
patterning the second layer into a mask layer; and
patterning the flash memory cell with the mask layer.

13. The method of claim 12, wherein the patterning of the second layer comprises:
forming an anti-reflective layer over the second layer; and
removing the anti-reflective layer using an acid.

14. A method of fabricating a semiconductor device, comprising:
providing a wafer having a first device and a second device located adjacent to the first device, wherein the first device comprises a non-volatile memory device that includes a floating gate and a control gate formed over the floating gate, and wherein a first step height exists at a boundary between the non-volatile memory device and the second device;
forming a first component at the boundary and on a sidewall of the control gate but not on a sidewall of the floating gate, wherein the first component provides a reduction in the first step height between the non-volatile memory device and the second device; and
forming, via a non-conformal deposition process, a mask layer over the non-volatile memory device and the second device, wherein the mask layer is formed to be continuous at least in part due to the first component providing the reduction in the first step height.

15. The method of claim 14, wherein the forming of the first component comprises:
depositing a dielectric layer over the non-volatile memory device and the second device; and
performing a spacer patterning process to the dielectric layer.

16. The method of claim 14, further comprising:
patterning the mask layer using a photoresist layer and an anti-reflective layer; and
applying an acid to remove the anti-reflective layer.

17. The method of claim 14, wherein:
the second device includes a first region and a second region;
a second step height exists at a boundary between the first region and the second region; and
the forming of the first component also forms a second component at the boundary between the first region and the second region, the second component providing a reduction in the second step height.

18. The method of claim 1, wherein the first topography variation is greater than the second topography variation.

19. The method of claim 9, wherein the first region is contiguous with the second region, and wherein the second region is contiguous with the third region.

20. The method of claim 9, wherein a continuous gate electrode layer spans horizontally into both the first region and the second region.

* * * * *